United States Patent
Umberto et al.

(10) Patent No.: US 11,884,165 B2
(45) Date of Patent: Jan. 30, 2024

(54) PANTOGRAPH ARC MONITORING SYSTEM AND METHOD

(71) Applicant: Hitachi, Ltd., Tokyo (JP)

(72) Inventors: Paoletti Umberto, Tokyo (JP); Aya Ohmae, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 602 days.

(21) Appl. No.: 17/056,295

(22) PCT Filed: Jul. 9, 2019

(86) PCT No.: PCT/JP2019/027138
§ 371 (c)(1),
(2) Date: Nov. 17, 2020

(87) PCT Pub. No.: WO2020/013178
PCT Pub. Date: Jan. 16, 2020

(65) Prior Publication Data
US 2021/0206277 A1     Jul. 8, 2021

(30) Foreign Application Priority Data

Jul. 10, 2018  (JP) ................................ 2018-130620

(51) Int. Cl.
*B60L 5/24* (2006.01)
*B60L 50/53* (2019.01)

(52) U.S. Cl.
CPC ................ *B60L 5/24* (2013.01); *B60L 50/53* (2019.02); *B60L 2200/26* (2013.01); *B60Y 2200/912* (2013.01)

(58) Field of Classification Search
CPC ........ B60L 5/24; B60L 50/53; B60L 2200/26; B60L 5/26; B60Y 2200/912; Y02T 10/70; Y02T 90/16; G01R 31/14; G01R 31/50
See application file for complete search history.

(56) References Cited

U.S. PATENT DOCUMENTS 4,023,093 A * 5/1977 Aslan ................... G01R 33/028
324/95
4,198,599 A   4/1980 Krider et al.
(Continued)

FOREIGN PATENT DOCUMENTS

CN        204536481 U    8/2015
EP        2 551 143 B1   3/2016
(Continued)

OTHER PUBLICATIONS

Gao et al., "Pantograph Catenary Arcing Detection Based on Electromagnetic Radiation", IEEE Transactions on Electromagnetic Compatibility, Jun. 20, 2018, pp. 983-989, vol. 61, No. 4, XP-002792130, pp. 1-11 (Year: 2018).*

(Continued)

*Primary Examiner* — Akm Zakaria
(74) *Attorney, Agent, or Firm* — Crowell & Moring LLP

(57) ABSTRACT

An object of the disclosure is to provide a technique for identifying an arc position between an overhead line and a pantograph mounted on an electric vehicle. A system according to the disclosure includes: a magnetic field detector configured to detects a magnetic field generated by an arc; and a first processor disposed in an electric vehicle and configured to determine a horizontal position of the arc on a pantograph by using the magnetic field detected by the detector.

8 Claims, 9 Drawing Sheets

(56) References Cited

U.S. PATENT DOCUMENTS

| | | | |
|---|---|---|---|
| 9,013,170 | B2 | 4/2015 | Yamaguchi et al. |
| 10,976,170 | B2 * | 4/2021 | Morgan-Brown ............................ G01C 21/3476 |
| 11,457,809 | B1 * | 10/2022 | Biederman ............ H04W 12/04 |
| 2010/0322465 | A1 * | 12/2010 | Wesche .................... B60M 1/28 348/125 |
| 2016/0311342 | A1 * | 10/2016 | Peng ........................ G06T 7/593 |
| 2017/0024880 | A1 | 1/2017 | Peng et al. |
| 2017/0131337 | A1 | 5/2017 | Barlini et al. |
| 2017/0136896 | A1 * | 5/2017 | Ricci ....................... H02J 50/70 |

FOREIGN PATENT DOCUMENTS

| | | |
|---|---|---|
| JP | 2007-288893 A | 11/2007 |
| JP | 2017-75890 A | 4/2017 |
| KR | 10-2012-0017723 A | 2/2012 |

OTHER PUBLICATIONS

Extended European Search Report issued in European Application No. 19834150.5 dated Mar. 9, 2022 (five (5) pages).

Gao et al., "Pantograph-Catenary Arcing Detection Based on Electromagnetic Radiation", IEEE Transactions on Electromagnetic Compatibility, Jun. 20, 2018, pp. 983-989, vol. 61, No. 4, XP-002792130, (seven (7) pages).

International Search Report (PCT/ISA/210) issued in PCT Application No. PCT/JP2019/027138 dated Aug. 20, 2019 with English translation (four (4) pages).

Japanese-language Written Opinion (PCT/ISA/237) issued in PCT Application No. PCT/JP2019/027138 dated Aug. 20, 2019 (four (4) pages).

* cited by examiner

PANTOGRAPH ARC MONITORING SYSTEM AND METHOD

TECHNICAL FIELD

The present disclosure relates to a monitoring system and a monitoring method of arc discharge between an overhead line and a pantograph of an electric vehicle that receives power from the overhead line.

BACKGROUND ART

An arc between an overhead line and a pantograph of an electric vehicle is generated when the overhead line and the pantograph are temporarily separated. This is due to, for example, vibration in a vertical direction or ice formed on the overhead line. In a high speed railway, the problem becomes more serious due to a high voltage. The arc may damage the pantograph due to a high temperature thereof, and may further indicate a failure of the overhead line. Therefore, arc monitoring is useful for maintenance of both pantograph and overhead line.

The overhead line is usually designed such that a horizontal position of the overhead line changes relative to the pantograph while the pantograph is moving. Therefore, a position where the arc occurs on the pantograph continuously changes. Since damage to the pantograph depends on intensity, a change over time, and the number of times of the arc at the same position, it is important to monitor the position where the arc occurs in the maintenance of the pantograph.

In maintenance of the overhead line, a geographical position of the arc in an infrastructure is important, which is consistent with a geographical position of the electric vehicle at a time of arc generation. By collecting information on the arc from a plurality of electric vehicles, the maintenance of the overhead line can be further improved. This may be implemented, for example, by identifying the geographical position where the arc is likely to occur in the infrastructure. If this can be implemented in real time, the failure of the overhead line can be identified earlier.

There are several existing patent applications that identify an arc position in a pantograph. For example, in US Patent Application Publications Nos. 2017/0024880A1 and 2016/0311342A1, a camera or a stereo camera is utilized, and in EP 2551143B1, an infrared camera is utilized. However, bad weather is expected to adversely affect camera sensitivity (especially optical camera). Further, a large amount of data generated by the camera cannot be easily transmitted to another device outside the electric vehicle. This is because transmission capability of the electric vehicle is limited. Therefore, in the related art, processing must be performed on the electric vehicle, which requires a great deal of processing capability. Alternatively, in the related art, it is necessary to mount a data storage device on the electric vehicle, which delays analysis processing.

US Patent Application Publication No. 2017/0131337A1 focuses on detecting arc generation and does not require large amounts of data. Accordingly, the technique may be used for maintenance of the overhead line at an infrastructure level. However, the document does not provide any information on identification of the arc on the pantograph.

U.S. Pat. Nos. 4,198,599 and 9,013,170B2 describe a use of an antenna to identify a position of lightning relative to the ground or relative to an aircraft. The antenna is, for example, a shield loop antenna. This type of technique for determining lightning direction is well known.

CITATION LIST

Patent Literature

PTL 1: US Patent Application Publication No. 2017/0024880A1
PTL 2: US Patent Application Publication No. 2016/0311342A1
PTL 3: EP2551143B1
PTL 4: US Patent Application Publication 2017/0131337A1
PTL 5: U.S. Pat. No. 4,198,599
PTL 6: U.S. Pat. No. 9,013,170B2

SUMMARY OF INVENTION

Technical Problem

The related art for identifying an arc position using a camera can accurately identify an arc position. This is because an image captured by the camera contains a large amount of information on an arc. On the other hand, it is usually necessary to transmit imaging data to a computer outside an electric vehicle. This is because a computational resource on a typical electric vehicle is limited. In this case, the electric vehicle needs to implement a high-speed communication channel between the electric vehicle and the computer outside the vehicle. This increases a cost of the electric vehicle.

PTL 5 and PTL 6 describe a method of determining a direction in which lightning is coming. However, the type of related art is not necessarily directly applicable to identification of the arc position on the electric vehicle. This is because these techniques of related art do not determine a direction of lightning in real time, whereas it may be necessary to process arc information in real time so as to identify the arc position on the electric vehicle.

The disclosure focuses on the problems described above, and an object of the disclosure is to provide a technique for identifying an arc position between an overhead line and a pantograph mounted on an electric vehicle.

Solution to Problem

A system according to the disclosure includes: a magnetic field detector configured to detect a magnetic field generated by an arc; and a first processor disposed in an electric vehicle and configured to determine a horizontal position of the arc on a pantograph using the magnetic field detected by the detector.

Advantageous Effect

According to the disclosure, it is possible to use a small amount of data to monitor an arc position on a pantograph by only simple data processing. As a result, arc information can be transmitted to and processed on an outside of a vehicle in almost real time together with information acquired by another electric vehicle. As a result, infrastructure maintenance can be improved.

DESCRIPTION OF EMBODIMENTS

First Embodiment

Figure 1:
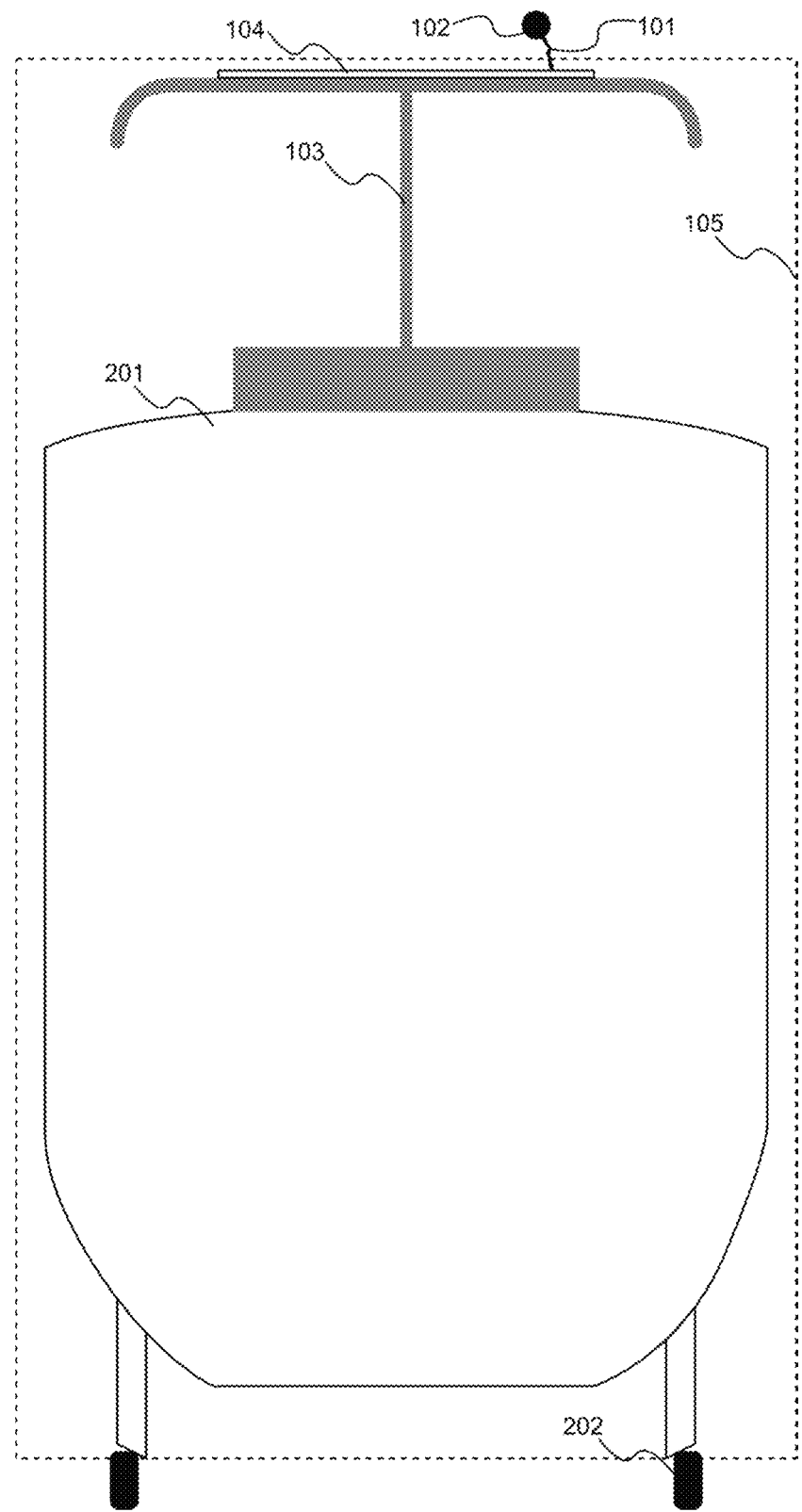
FIG. 1 is a schematic view of a general situation in which an arc occurs in an electric vehicle 105.

FIG. 1 is a schematic view of a general situation in which an arc occurs in an electric vehicle 105. Power is drawn out from an overhead line 102 by a pantograph 103 attached to an upper surface of a vehicle body 201, and goes out of the electric vehicle 105 via a rail 202. The pantograph 103 includes a contact plate 104. The contact plate 104 is for mechanically bringing the pantograph 103 and the overhead line 102 into contact with each other. When the overhead line 102 and the contact plate 104 on an upper surface of the pantograph 103 are separated from each other, an arc discharge 101 is formed.

The contact plate 104 is damaged by mechanical stress and current heating. Accordingly, maintenance is periodically performed on the contact plate 104. This is because such damage can be predicted. On the other hand, depending on an intensity, a time length, and the number of times of an arc, the contact plate 104 may be partially damaged, and in that case, it is necessary to replace the contact plate 104 more frequently than the number of times of periodic maintenance. Since a position of the overhead line 102 on the contact plate 104 changes continuously while the electric vehicle 105 is traveling, and arc generation cannot be predicted, it is necessary to monitor an arc phenomenon so as to estimate a state of the contact plate 104. More specifically, it is necessary to monitor the position, the intensity, and the time length of the arc on the contact plate 104. More generally, it is necessary to monitor changes over time of the arc.

Further, a large number of arcs occurring at the same geographical position in the infrastructure may indicate a failure in the overhead line 102. In order to cope with such a failure in the overhead line, it is necessary to monitor the geographical position of the arc with respect to the infrastructure for all the electric vehicles 105 traveling in the infrastructure.

Since information is wirelessly transmitted from the moving electric vehicle 105, transmission capability is limited, and quality of data transmitted for monitoring must be maintained at a low level. Further, a computational resource that can be mounted on the electric vehicle 105 is mainly limited by a cost of a vehicle. The disclosure seeks to accurately identify an arc position, even with such limited computational capability and network capability.

Figure 2:
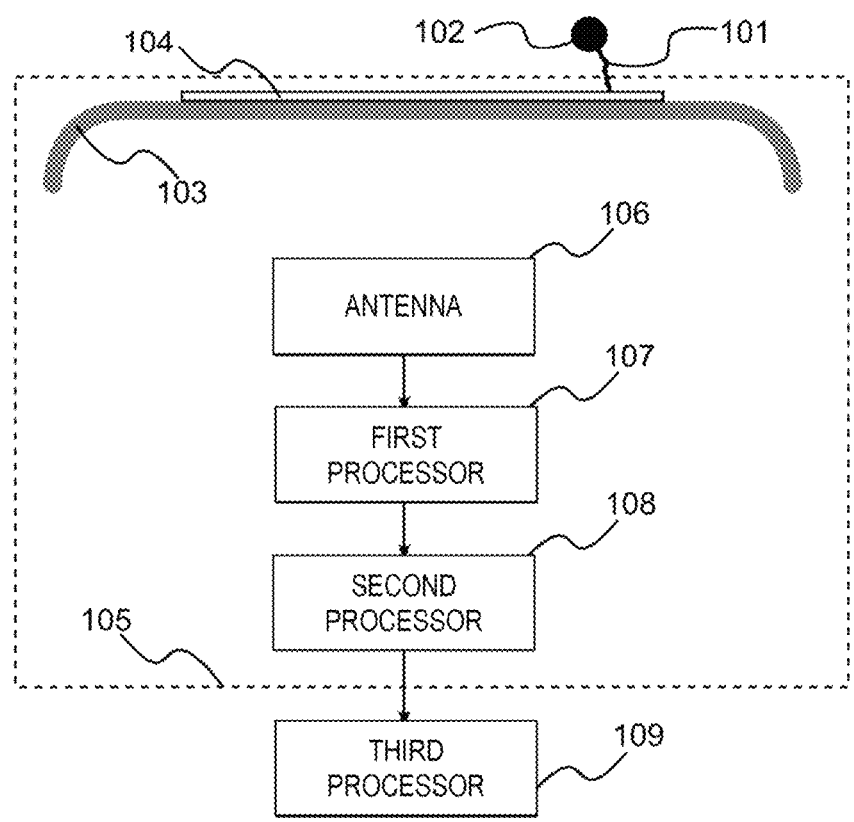
FIG. 2 is a schematic view showing a system configuration according to a first embodiment of the disclosure.

FIG. 2 is a schematic view showing a system configuration according to a first embodiment of the disclosure. The system includes an antenna 106, a first processor 107, a second processor 108, and a third processor 109. The first processor 107 and the second processor 108 can be mounted in the electric vehicle 105. That is, these processors are on the vehicle. The third processor 109 can be disposed outside the electric vehicle 105. The second processor 108 communicates with the third processor 109 to transmit data to be described later. Details of these processors will be described below with reference to the drawings.

Figure 3:
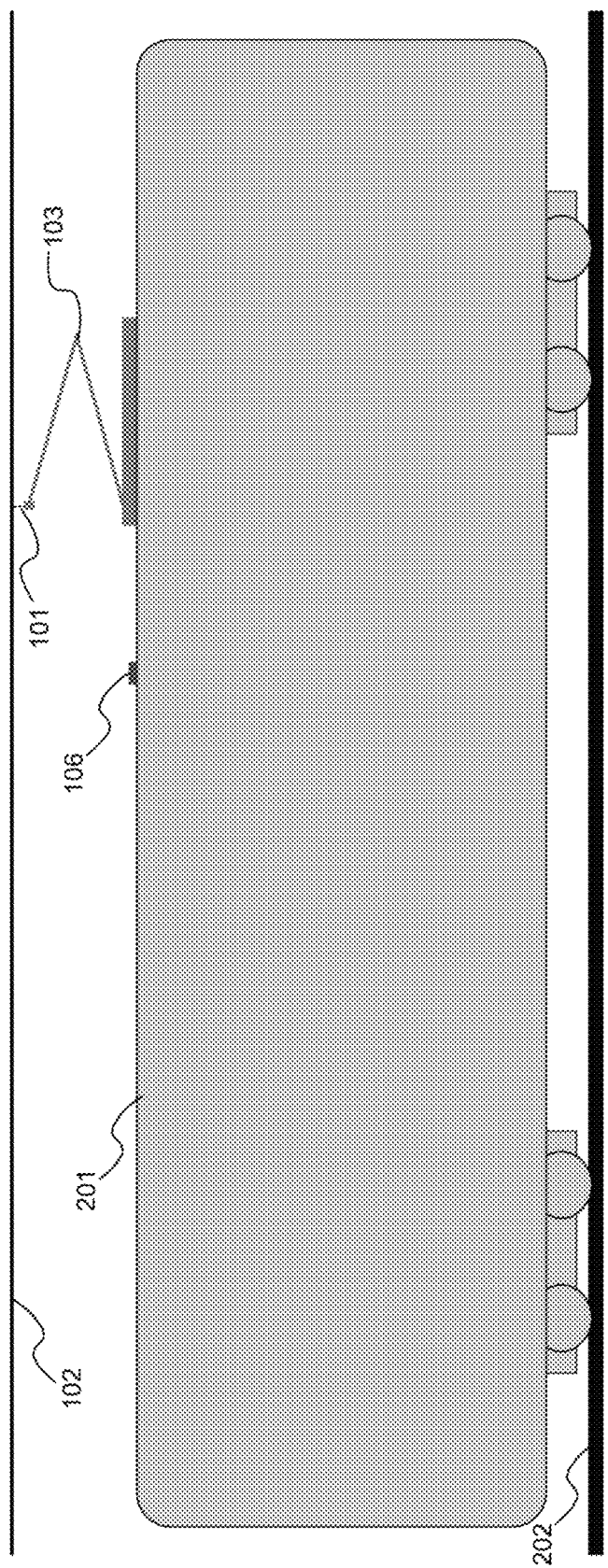
FIG. 3 is a schematic view of a side surface of the electric vehicle 105 traveling on a rail 202.

FIG. 3 is a schematic view of a side surface of the electric vehicle 105 traveling on a rail 202. The electric vehicle 105 draws out power from the overhead line 102 by the pantograph 103 disposed on an upper surface of the vehicle body 201. The arc 101 is generated as a result of the overhead line 102 and the pantograph 103 being temporarily separated.

The antenna 106 is attached to the upper surface of the vehicle body 201 so as to detect the arc generation and the arc position on the pantograph 103. A meaning of the antenna mentioned here should be interpreted in a broad sense, and a combination of single antennas suitable for determining an angular direction at which the arc arrives is also included in the antenna mentioned here.

Figure 4:
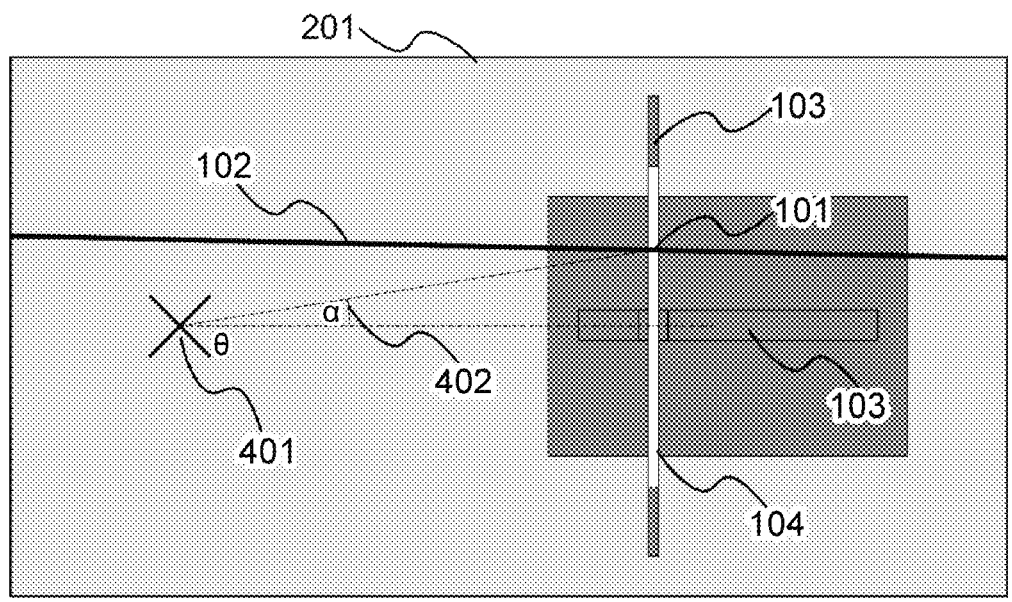
FIG. 4 is a top view of the electric vehicle 105.

FIG. 4 is a top view of the electric vehicle 105. It is desirable that the antenna 106 includes two shield loop antennas 401. The type of antenna configuration is advantageous in that the antenna is easy to manufacture and is less sensitive to an electric field. An angle formed between the two antennas need not be 90 degrees as shown, but may be optimized for each specific design depending on a distance from the pantograph 103 to the antenna to increase an angular resolution. The two loop antennas 401 make it possible to identify an angular position 402 of the arc with respect to a center of the pantograph 103. A detailed procedure for calculating the angular position α from the antennas 401 to the arc position will be described later.

Figure 5:
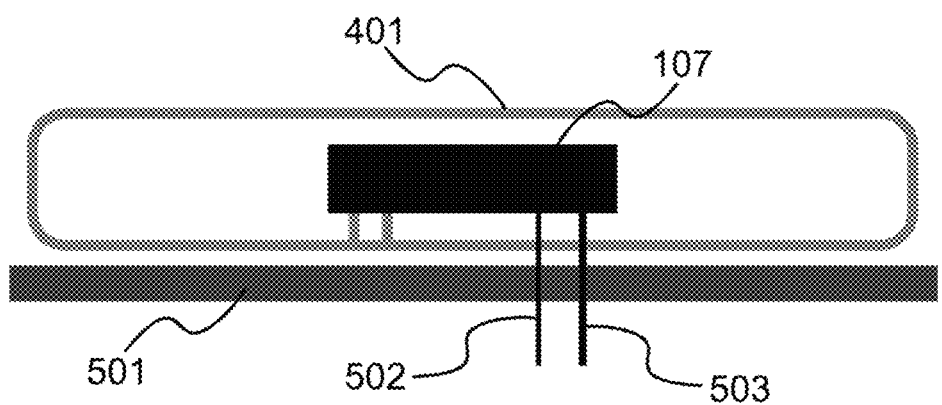
FIG. 5 is a schematic cross-sectional view of shield loop antennas 401 disposed on an upper surface of a vehicle body roof 501.

FIG. 5 is a schematic cross-sectional view of the shield loop antennas 401 disposed on an upper surface of a vehicle body roof 501. It is desirable that the first processor 107 is connected to the loop antennas 401 by a power supply cable 502 and a data cable 503 which penetrate the vehicle body roof 501 within a very close distance to the antennas 401. The power supply cable 502 and the data cable 503 need not be separated, and may be integrated into a single cable to convey power and data together. In another configuration, the first processor 107 may be disposed under the roof by extending a connection to the antennas 401 and eliminating a need to dispose an active component that requires a power source on the vehicle body roof 501.

Figure 6:
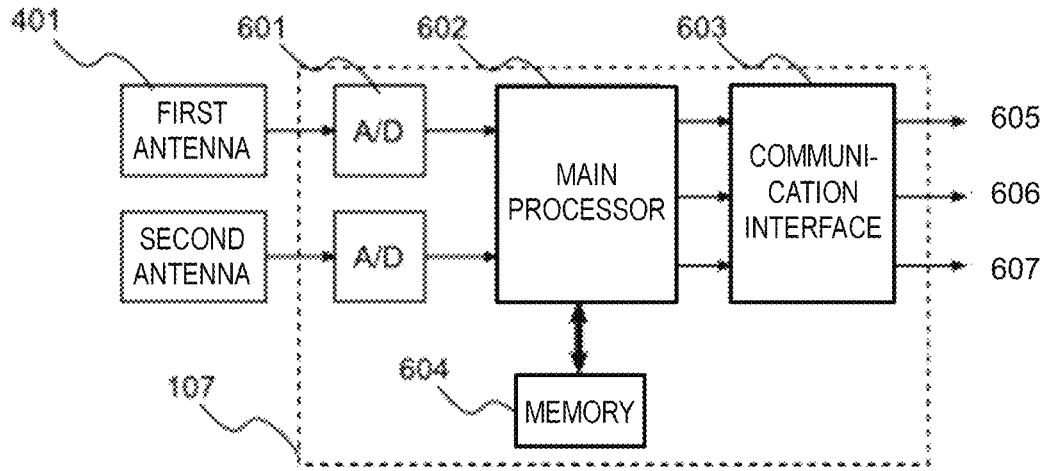
FIG. 6 is a functional block diagram of a first processor 107.

FIG. 6 is a functional block diagram of the first processor 107. Signals from the shield loop antennas 401 are respectively digitized by AD converters 601. A digital signal is processed by a main processor 602. The main processor 602 supplementally uses the memory 604. Processing of the main processor 602 determines a horizontal position of the arc on the pantograph 103. Data processed for a single arc generation event is transmitted by a communication interface 603 as soon as the arc occurs. This eliminates a need to store an event over a long period of time, except where a continuous event needs to be buffered.

Specifically, the data calculated and transmitted by the first processor 107 includes: information 605 on the horizontal position of the arc on the pantograph; intensity data

606 that describes an energy of the arc; and an occurrence time 607 that describes a time point when the arc occurs. The intensity data 606 should be interpreted in a broad sense as data related to the energy propagated during arc generation, and may include physical quantities such as voltage, current, electric charge, power, or energy, and may include a time length or a change over time. For example, the intensity data 606 is a waveform in a time domain or a frequency domain of antenna signals acquired on the antennas 401. The occurrence time 607 can be described in an optionally format as long as the time point at which the arc occurs can be uniquely identified. For example, the occurrence time 607 may describe a year, a month, a day, an hour, a minute, a second, and the like of the arc generation.

Figure 7:
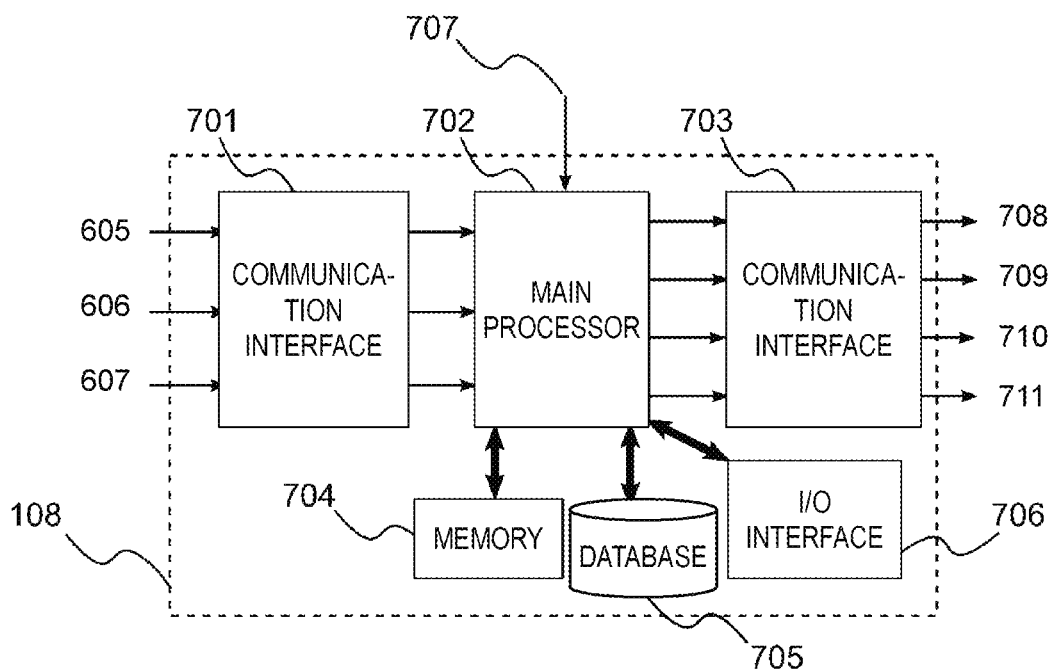
FIG. 7 is a functional block diagram of a second processor 108.

FIG. 7 is a functional block diagram of the second processor 108. A communication interface 701 receives data from the first processor 107. The main processor 702 processes the received data using an instruction in a memory 704 to estimate a state of the pantograph 103 and estimate the geographical position of the arc in the infrastructure. The main processor 702 stores calculated data in a database 705. The geographical position of the arc is calculated by considering vehicle position information 707 at a time of the arc generation. The vehicle position information 707 describes the geographical position of the electric vehicle 105 in the infrastructure when the arc is generated, and can be acquired from, for example, an infrastructure side.

The memory 704 and the database 705 are not necessarily physically separated, and may be the same object. Processing by the main processor 702 includes integrating successive single events, removing non-critical events, modifying the intensity data 606, applying a correction factor to the intensity data 606 and the time point data 607, and the like, but is not limited thereto. The data processed for the single arc event is transmitted by the communication interface 703 immediately after being processed by the main processor 702.

Specifically, the data transmitted by the main processor 702 includes: information 708 on the arc position on the pantograph 103; intensity data 709; occurrence time 710; and information 711 related to the geographical position of the arc in the infrastructure. Although not necessarily required, an input and output interface 706 for accessing data in the second processor 108 may be provided.

Figure 8:
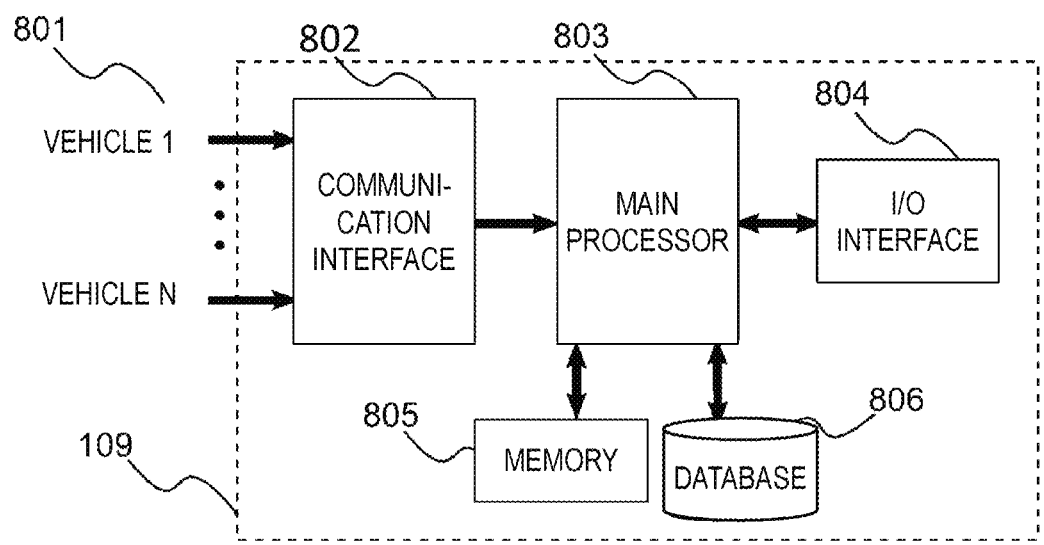
FIG. 8 is a functional block diagram of a third processor 109.

FIG. 8 is a functional block diagram of the third processor 109. The communication interface 802 receives vehicle data 801 from the second processor 108 of each of a plurality of electric vehicles 105 traveling on the infrastructure. A main processor 803 supplementarily uses the memory 805 to store the received data in a database 806. Also in this case, the memory 805 and the database 806 need not be physically separated, and may be the same object. The main processor 803 processes the received data to estimate a state of the overhead line 102, and stores a calculation result in the database 806. The data stored in the database 806 can be accessed via the input and output interface 804.

Figure 9:
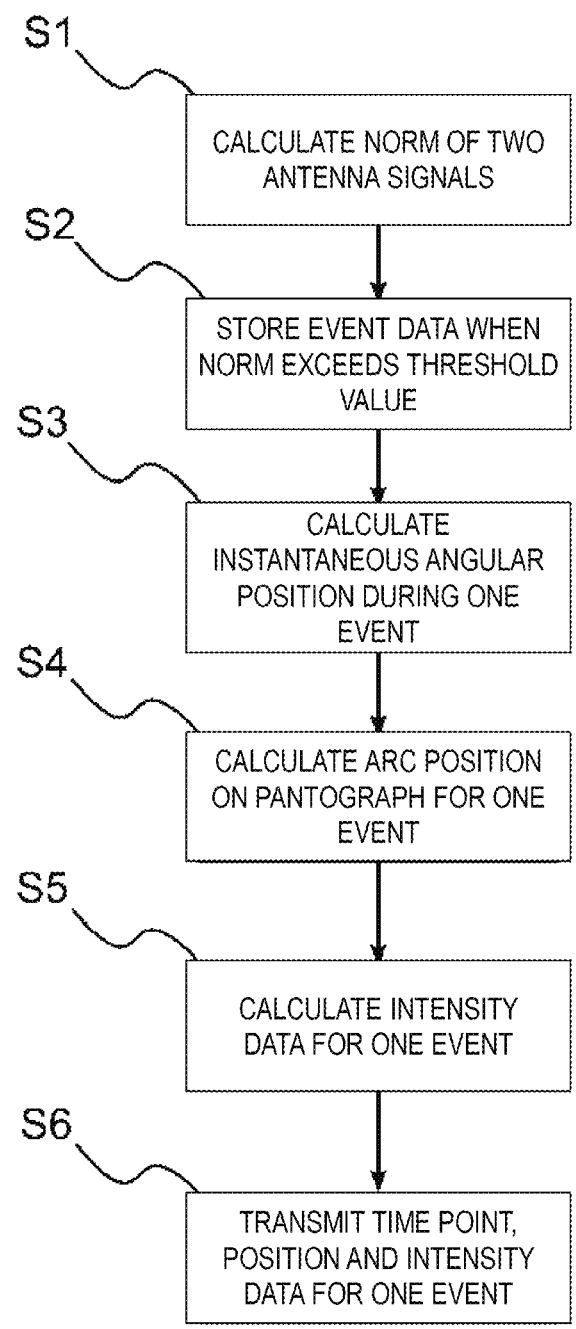
FIG. 9 is a flowchart showing a procedure executed by the first processor 107.

FIG. 9 is a flowchart showing a procedure executed by the first processor 107. Hereinafter, each step in FIG. 9 will be described.

In step S1, the first processor 107 calculates a norm of the antenna signals that change over time. For example, the norm can be calculated as a square root of a sum of squares of the signal intensities received by the antennas 401. That is, when the signal received by one of the antennas 401 is x1 and the signal received by the other antenna 401 is x2, the norm is $|x1|^2+|x2|^2)^{1/2}$.

In step S2, the first processor 107 compares a norm (calculated in step S1) level with a threshold value. When the norm level exceeds the threshold value, the first processor 107 stores the received waveform over a period time in which the norm exceeds the threshold value. The period time represents the time length of the single arc event. When an oscillation phenomenon appears, a plurality of events may be integrated into a single arc event in subsequent post-processing.

In step S3, the first processor 107 calculates the angular position of the arc on the pantograph 103 for each of the single arc events. The angular position depends on a time point since the angular position changes over time. For example, in a case of two orthogonal shield loop antennas, an angular position α(t) in radians that changes over time can be calculated by the following Equation (1):

[Math 1]

$$\alpha(t) = \theta + \tan^{-1}\frac{x_2(t)}{x_1(t)} \tag{1}$$

in which $x_1(t)$ and $x_2(t)$ are antenna signals representing the magnetic field; θ is a fixed angle depending on an orientation of the antennas 401 with respect to the pantograph 103 (see FIG. 4). For example, when the antennas 401 are oriented as shown in FIG. 4, θ=π/4. Depending on the used antennas, a more complex procedure may be used to calculate the angular position α(t).

In a point where an angular interval for searching for an arc generation source is narrow, identification of the arc position of the pantograph using the antennas is different from a technique for identifying a position of a noise generation source as in PTL 5 and PTL 6. This is because a size of the contact plate 104 is relatively small with respect to a distance from the antennas. For example, when an 80-cm contact plate 104 is at a distance of 3 m from the antennas, the arc position is identified only within the angular interval of about 15 degrees. Using the fact, a spatial resolution can be increased by normalizing the antenna signals with respect to a reference value. The reference value is, for example, an antenna signal when the arc generation source is known. For example, the reference value is an antenna signal when the arc generation source is a center of the pantograph 103.

In step S4, the first processor 107 determines one arc position for each event. Step S4 is performed based on a statistical evaluation of the antenna signals and the angular position, and a size of the pantograph 103 and distances from the antennas to the pantograph 103.

In step S5, the first processor 107 calculates the intensity data 606 for the single arc event. An example of the intensity data 606 is as described above. That is, the intensity data 606 can be described by considering amplitudes of the antenna signals, the time length of the arc event, or the change over time of the antenna signals.

In step S6, the first processor 107 transmits the estimated arc position 605, the intensity data 606, and the occurrence time 607 for each event to the second processor 108. The second processor 108 need not necessarily be disposed near the antennas, and thus the distances from the antennas to the second processor 108 may be longer than the distance from the antennas to the first processor 107.

Figure 10:
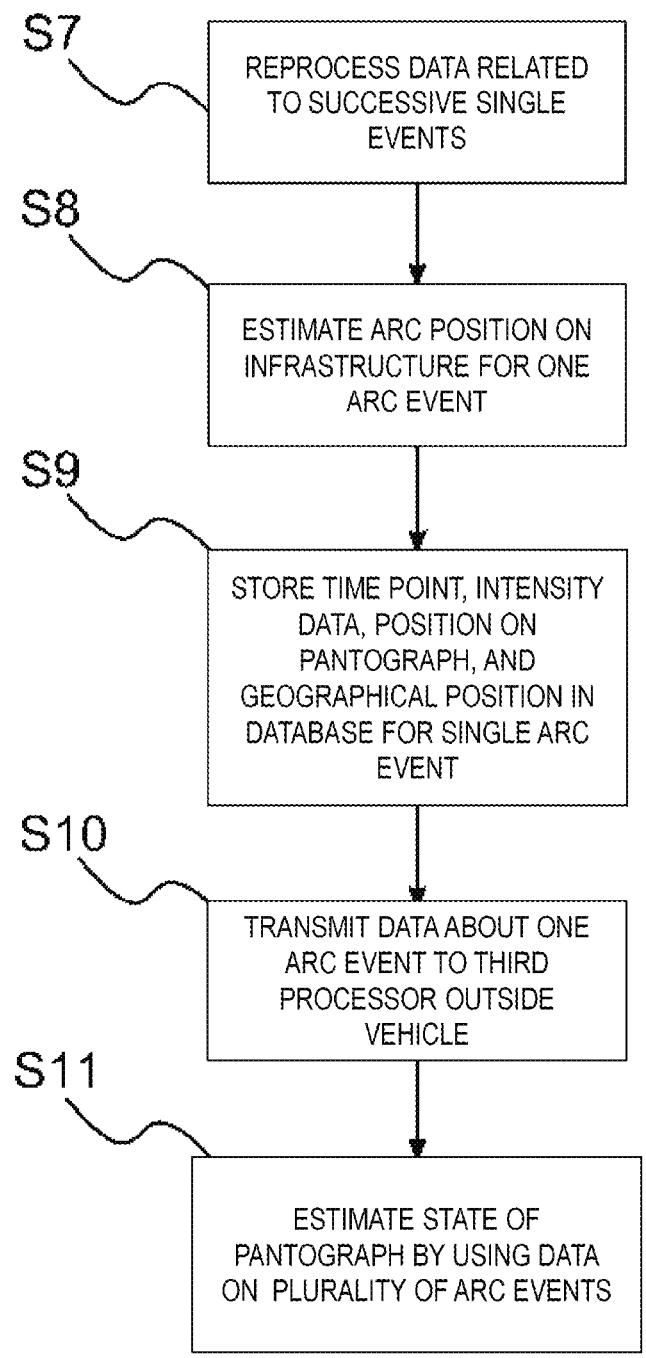
FIG. 10 is a flowchart showing a procedure executed by the second processor 108.

FIG. 10 is a flowchart showing a procedure executed by the second processor 108. Hereinafter, each step in FIG. 10 will be described.

In step S7, the second processor 108 may integrate successive arc events into the single arc event as desired. For example, the successive arc events occur within a very short period of time. The second processor 108 may also apply a correction factor or another processing technique to the intensity data 606 and the time point data 607, thereby improving definition and accuracy of the arc events.

In step S8, the second processor 108 estimates the geographical position of the single arc event in the infrastructure based on an arc time point and the vehicle position information 707.

In step S9, the second processor 108 stores arc event data in the database 705. The arc event data includes the time point, the intensity data, the position on the pantograph, and the geographical position in the infrastructure of each arc.

In step S10, the second processor 108 transmits data related to each arc event to the third processor 109 disposed outside the electric vehicle 105.

In step S11, the second processor 108 estimates a state of the pantograph 103 by using data about a plurality of arc events. In other words, the second processor 108 estimates a damage caused by a plurality of arcs on the pantograph 103. The damage can generally be estimated, for example, from the energy imparted by the arcs to the pantograph 103.

Figure 11:
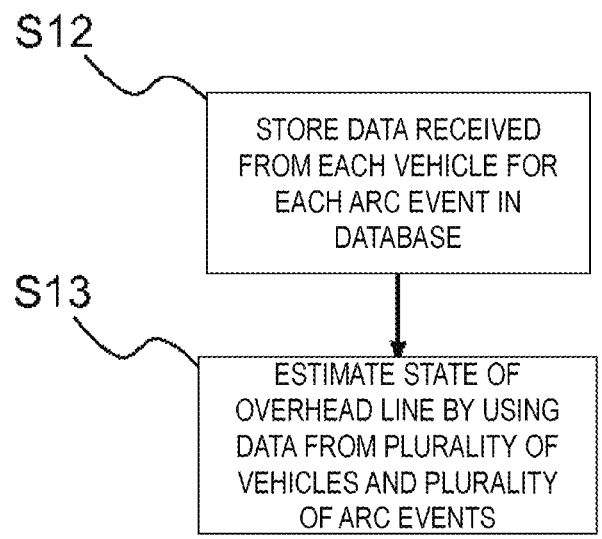
FIG. 11 is a flowchart showing a procedure executed by the third processor 109.

FIG. 11 is a flowchart showing a procedure executed by the third processor 109. Hereinafter, each step in FIG. 11 will be described.

In step S12, the third processor 109 stores the arc event data from the plurality of electric vehicles 105 in the database 806. In step S13, the third processor 109 estimates a state of the overhead line 102 based on data from the plurality of electric vehicles 105 and data from the plurality of arc events. For example, when the plurality of arc events occur on the same geographical position for the plurality of electric vehicles 105, the overhead line 102 may be corrupted at the geographical position.

First Embodiment: Summary

The system according to the first embodiment estimates the angular position of the arc on the pantograph 103 by using the magnetic field detected by the antennas 401. The estimation is performed substantially in real time by the first processor 107, and the first processor 107 is disposed on the electric vehicle 105 and near the antennas 401. Therefore, the electric vehicle 105 does not need to implement a high-performance processor or a high-speed network channel so as to estimate the arc position. This is because the first processor 107 does not use large-capacity data like a high-resolution camera, and thus it is not necessary to process and transmit such large-capacity data.

The system according to the first embodiment estimates the state of the pantograph 103 based on the plurality of arc events on the same electric vehicle 105. The estimation can be performed by the second processor 108 on the electric vehicle 105. This is because the data that describes each arc event is not as large as a camera image, and thus the electric vehicle 105 does not need to implement a high performance processor for the second processor 108.

The system according to the first embodiment estimates a state of the overhead line 102 based on the arc event data collected from the plurality of electric vehicles 105. Since stress on the overhead line 102 is usually predictable, the maintenance of the infrastructure is typically performed periodically. According to the first embodiment, maintenance efficiency is improved. This is because damage to the overhead line 102 caused by an irregular arc event can be estimated in addition to periodic maintenance.

Second Embodiment

In a second embodiment of the disclosure, a specific configuration example of a system will be described. A configuration other than specific details is the same as that of the first embodiment, and thus will not be described again.

Figure 12:
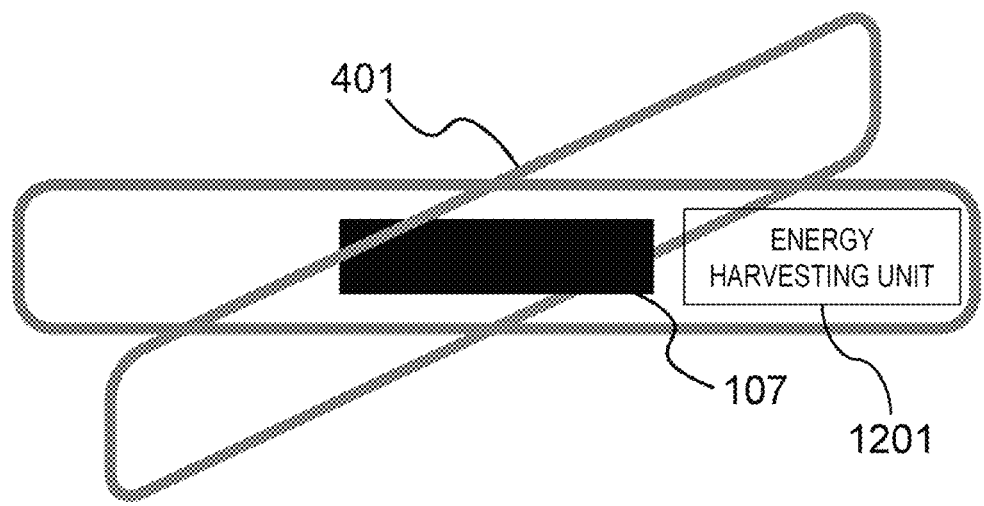
FIG. 12 is a configuration of a first processor according to a second embodiment.

FIG. 12 is a configuration of a first processor according to the second embodiment. In the configuration in FIG. 12, the first processor 107 receives power from an energy harvesting unit 1201 and communicates with the second processor 108 via a wireless connection. In this way, the cable connections 502 and 503 that pass through the vehicle body roof 501 are not required. As the energy harvesting unit 1201, any type of unit that acquires electrical energy from environment can be used. The energy harvesting unit 1201 may be disposed near the first processor 107, or may be disposed remotely from the first processor 107 and connected to the first processor 107 by, for example, a power cable.

In the first embodiment, it is assumed that the second processor 108 transmits arc event data to the third processor 109. When the third processor 109 is not present in the system or the second processor 108 is difficult to transmit the arc event data, the arc event data may be temporarily stored in the database 705. The arc event data in the database 705 is acquired by a central computer or the like after the electric vehicle 105 is stopped. In this case, steps S10, S12, and S13 associated with the third processor 109 may be omitted.

<Modification of Present Invention>

The invention is not limited to the embodiments described above, and includes various modification examples. For example, the above-mentioned embodiments have been described in detail for easy understanding of the present invention, and are not necessarily limited to those including all the configurations described above. A part of the configuration of one embodiment can be replaced with the configuration of another embodiment, and the configuration of another embodiment can be added to the configuration of one embodiment. A part of the configuration of each embodiment may be added to, deleted from, or replaced with another configuration.

In the above embodiment, an arc position is identified on the electric vehicle 105. The disclosure is applicable to any type of electric vehicle, as long as an overhead line that supplies power to a motor vehicle and a contact plate that receives power from the overhead line are related.

In the above embodiment, the antennas 401 detect the magnetic field generated by the arc 101. The disclosure is not limited to such a configuration, and any type of magnetic field detector can be employed as long as the angular position $\alpha(t)$ can be calculated.

A part or all of the above-mentioned configurations, functions, processing units, processing sections, and the like may be implemented by hardware, for example, by designing an integrated circuit. Alternatively, the configurations, functions, and the like described above may be implemented by software by means of a processor interpreting and executing a program for implementing respective functions. Information such as a program, a table, and a file for realizing each function can be placed in a recording device such as a memory, a hard disk, or a solid state drive (SSD), or in a recording medium such as an IC card, an SD card, or a DVD.

REFERENCE SIGN LIST

101: arc
102: overhead line

103: pantograph
104: contact plate
105: electric vehicle
106: antenna
107: first processor
108: second processor
109: third processor

The invention claimed is:

1. A system configured to monitor an arc between an overhead line and a pantograph of an electric vehicle, the pantograph collecting current for the electric vehicle from the overhead line, the system comprising:
 a magnetic field detector configured to detect a change in a magnetic field generated by the arc; and
 a first processor configured to determine a horizontal position of the arc on the pantograph, and output first data that describes the horizontal position, an occurrence time of the arc, and an intensity of the arc, wherein
 the magnetic field detector is disposed adjacent to the pantograph, and
 the first processor is disposed in the electric vehicle,
 wherein the magnetic field detector includes two shield loop antennas, and
 wherein the first processor is configured to determine the horizontal position by using a tilt of the shield loop antenna with respect to the pantograph, a first antenna signal received by a first shield loop antenna when the arc occurs, and a second antenna signal received by a second shield loop antenna when the arc occurs, so as to determine an angular position with respect to the arc from the shield loop antenna.

2. The system according to claim 1, further comprising:
 a first database configured to store the horizontal position, the occurrence time, and the intensity; and
 a second processor configured to receive the first data from the first processor, store the received first data in the first database, and process the first data to estimate a state of the pantograph, wherein
 the second processor is disposed in the electric vehicle, and
 the second processor is configured to acquire a plurality of pieces of the first data from the first processor and collect information on occurrence events of a plurality of arcs, and estimate the state of the pantograph in accordance with the plurality of occurrence events of the arcs.

3. The system according to claim 2, wherein
 the second processor is configured to receive information that describes a first geographical position of the electric vehicle in an infrastructure in which the electric vehicle is traveling when the arc is generated, and
 the second processor is configured to determine a second geographical position of the arc in the infrastructure in accordance with the first geographical position, and transmit second data that describes the second geographical position of the arc.

4. The system according to claim 3, further comprising:
 a second database configured to store the second geographical position of the arc; and
 a third processor configured to receive the second data from the second processor, store the received second data in the second database, and process the second data to estimate a state of the overhead line, wherein
 the third processor is disposed outside the electric vehicle,
 the third processor is configured to receive the second data from a plurality of electric vehicles traveling in the infrastructure, and store the second data received from the plurality of electric vehicles in the second database, and
 the third processor is configured to estimate the state of the overhead line in accordance with a plurality of pieces of the second data stored in the second database.

5. The system according to claim 1, wherein
 the first processor is configured to normalize the first antenna signal and the second antenna signal with respect to a reference value obtained by the shield loop antenna when the shield loop antenna receives a magnetic field from a known position on the pantograph, and
 the first processor is configured to determine the angular position by using the normalized antenna signals.

6. The system according to claim 2, wherein
 the intensity of the arc represents an energy imparted to the pantograph from the arc, and
 the second processor is configured to estimate a damage to the pantograph in accordance with the energy represented by the intensity of the arc.

7. The system according to claim 1, wherein
 the first processor is configured to receive power and communicate with another device via one or more cables.

8. The system according to claim 1, wherein
 the first processor is configured to receive power by an energy harvesting unit disposed adjacent to the first processor, and wirelessly communicate with another device.

* * * * *